(12) United States Patent
Kim et al.

(10) Patent No.: US 10,347,796 B2
(45) Date of Patent: Jul. 9, 2019

(54) LIGHT-EMITTING ELEMENT MOUNTING SUBSTRATE AND LIGHT-EMITTING PACKAGE USING THE SAME

(71) Applicant: SAMSUNG ELECTRONICS CO., LTD., Suwon-si (KR)

(72) Inventors: Jung Hoon Kim, Hwaseong-si (KR); Jacob-Changlin Tarn, Hwaseong-si (KR); Il Woo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 98 days.

(21) Appl. No.: 15/438,267

(22) Filed: Feb. 21, 2017

(65) Prior Publication Data

US 2017/0256682 A1 Sep. 7, 2017

(30) Foreign Application Priority Data

Mar. 2, 2016 (KR) .................. 10-2016-0025054

(51) Int. Cl.
*H01L 33/46* (2010.01)
*H01L 33/48* (2010.01)
(Continued)

(52) U.S. Cl.
CPC ............ *H01L 33/486* (2013.01); *H01L 33/46* (2013.01); *H01L 33/504* (2013.01); *H01L 33/62* (2013.01);
(Continued)

(58) Field of Classification Search
CPC ....... H01L 33/62; H01L 33/486; H01L 33/48; H01L 33/502; H01L 2224/16225
See application file for complete search history.

(56) References Cited

U.S. PATENT DOCUMENTS 7,655,957 B2 2/2010 Loh et al.
7,755,095 B2 7/2010 Nagai
(Continued)

FOREIGN PATENT DOCUMENTS

EP 2011163 11/2007
EP 2372801 A2 10/2011
(Continued)

*Primary Examiner* — Timor Karimy
(74) *Attorney, Agent, or Firm* — Sughrue Mion, PLLC

(57) ABSTRACT

A light-emitting element mounting substrate is provided. The light-emitting element mounting substrate includes an insulating base plate comprising a first surface, a second surface facing the first surface, and a plurality of pad regions disposed on the first surface in an m-by-n matrix form, each of m and n being a natural number; a first conductive pad that is disposed in one of the plurality of pad regions and is in contact with the insulating base plate; a second conductive pad that is disposed in another one of the plurality of pad regions apart from the first conductive pad and is in contact with the insulating base plate; a first through hole disposed at a position corresponding to the first conductive pad to penetrate the insulating base plate; a second through hole that is disposed at a position corresponding to the second conductive pad to penetrate the insulating base plate and is spaced apart from the first through hole; a first through conduit filling the first through hole and being in contact with the first conductive pad; and a second through conduit filling the second through hole and being in contact with the second conductive pad.

20 Claims, 12 Drawing Sheets

(51) Int. Cl.
   *H01L 33/50*   (2010.01)
   *H01L 33/62*   (2010.01)
   *H01L 33/60*   (2010.01)

(52) U.S. Cl.
   CPC .... *H01L 33/60* (2013.01); *H01L 2224/16225* (2013.01)

(56) References Cited

U.S. PATENT DOCUMENTS

| | | |
|---|---|---|
| 7,880,185 B2 | 2/2011 | Nagai |
| 8,232,564 B2 | 7/2012 | Chakraborty |
| 8,378,374 B2 | 2/2013 | Loh et al. |
| 8,841,172 B2 | 9/2014 | Wei et al. |
| 9,029,891 B2 | 5/2015 | Muramatsu et al. |
| 2007/0058059 A1* | 3/2007 | Suehiro ................ H01L 33/486 348/294 |
| 2011/0241049 A1 | 10/2011 | Tanida et al. |
| 2012/0075202 A1 | 3/2012 | Michaelis |
| 2012/0311856 A1* | 12/2012 | Yoshimura ............ H01L 33/62 29/829 |
| 2013/0001618 A1 | 1/2013 | Imai et al. |
| 2013/0037834 A1 | 2/2013 | Happoya et al. |
| 2014/0027893 A1* | 1/2014 | Chou .................... H05K 1/112 257/676 |
| 2014/0361200 A1 | 12/2014 | Rudmann et al. |
| 2015/0084080 A1* | 3/2015 | Kawakita ............. H01L 25/167 257/98 |
| 2016/0190412 A1* | 6/2016 | Okura ................ H01L 21/4846 257/98 |
| 2016/0284946 A1* | 9/2016 | Hsing Chen ............ H01L 33/50 |

FOREIGN PATENT DOCUMENTS

| | | |
|---|---|---|
| EP | 2500954 A1 | 9/2012 |
| EP | 1700344 B1 | 3/2016 |
| JP | 2007517378 A | 6/2007 |
| JP | 5746076 B2 | 7/2015 |
| KR | 1020120099648 A | 9/2012 |
| WO | 2005062389 A2 | 7/2005 |
| WO | 2007126720 A2 | 11/2007 |
| WO | 2011058849 A1 | 5/2011 |

* cited by examiner

LIGHT-EMITTING ELEMENT MOUNTING SUBSTRATE AND LIGHT-EMITTING PACKAGE USING THE SAME

CROSS-REFERENCE TO RELATED APPLICATION

This application claims priority from Korean Patent Application No. 10-2016-0025054 filed on Mar. 2, 2016 in the Korean Intellectual Property Office, the disclosure of which is incorporated herein by reference in its entirety.

BACKGROUND

1. Field

Apparatuses consistent with example embodiments relate to a light-emitting element mounting substrate and a light-emitting package using the same.

2. Description of the Related Art

A light-emitting diode, which is an element for emitting light from a material included therein using electric energy, converts the energy generated by the recombination of electrons and holes of a semiconductor junction into light and emits the light. Such a light-emitting diode has widely been used as an illuminating device, a display device, or a light source, and the development thereof has been accelerated.

In particular, thanks to the commercialization of mobile phone keypads, turn signal lamps, camera flashes, and the like using gallium nitride (GaN)-based light-emitting diode having recently been developed and activated, the development of general illumination using light-emitting diodes has recently been activated. Light-emitting diodes have been used for large-size, high powered and high functionalized application products, such as backlight units of large-size TVs, headlights of automobiles, and general illuminations. Therefore, methods for improving the light extraction efficiency of such light-emitting elements and methods for reducing the size of a light emitting apparatus including the light-emitting elements, and methods for improving heat dissipation have been required.

SUMMARY

One or more example embodiments provide a light-emitting element mounting substrate, which can improve the dissipation of heat and can reduce the production cost of a light-emitting apparatus.

Further, one or more example embodiments provide a light-emitting element mounting substrate, which can reduce the production cost of a module by minimizing a light emitting surface (LES) and which can be used as a single light source by minimizing a multi-shadow effect.

Further still, one or more example embodiments provide a light-emitting package which can reduce the size of a package by using the light-emitting element mounting substrate.

According to an aspect of an example embodiment, there is provided a light-emitting element mounting substrate including: an insulating base plate comprising a first surface, a second surface facing the first surface, and a plurality of pad regions disposed on the first surface in an m-by-n matrix form, each of m and n being a natural number; a first conductive pad that is disposed in one of the plurality of pad regions and is in contact with the insulating base plate; a second conductive pad that is disposed in another one of the plurality of pad regions apart from the first conductive pad and is in contact with the insulating base plate; a first through hole disposed at a position corresponding to the first conductive pad to penetrate the insulating base plate; a second through hole that is disposed at a position corresponding to the second conductive pad to penetrate the insulating base plate and is spaced apart from the first through hole; a first through conduit filling the first through hole and being in contact with the first conductive pad; and a second through conduit filling the second through hole and being in contact with the second conductive pad.

According to an aspect of another example embodiment, there is provided a light-emitting package including: a light-emitting element mounting substrate, a light-emitting element mounted on the light-emitting element mounting substrate, a first fluorescent layer disposed on an upper surface of the light-emitting element; and a second fluorescent layer covering a side wall of the light-emitting element, wherein the light-emitting element mounting substrate comprises: an insulating base plate comprising a first surface, a second surface facing the first surface, and a plurality of pad regions disposed on the first surface in an m-by-n matrix form, each of m and n being a natural number; a first conductive pad that is disposed in one of the plurality of pad regions and is in contact with the insulating base plate; and a second conductive pad that is disposed in another one of the plurality of pad regions apart from the first conductive pad and is in contact with the insulating base plate. The light-emitting element is disposed to overlap the first conductive pad and the second conductive pad.

BRIEF DESCRIPTION OF THE DRAWINGS

The above and other aspects will be more apparent by describing certain embodiments, with reference to the attached drawings, in which.

DETAILED DESCRIPTION OF THE EXAMPLE EMBODIMENTS

Hereinafter, a light-emitting element mounting substrate according to an example embodiment will be described with reference to FIGS. 1 and 2.

Figure 1:
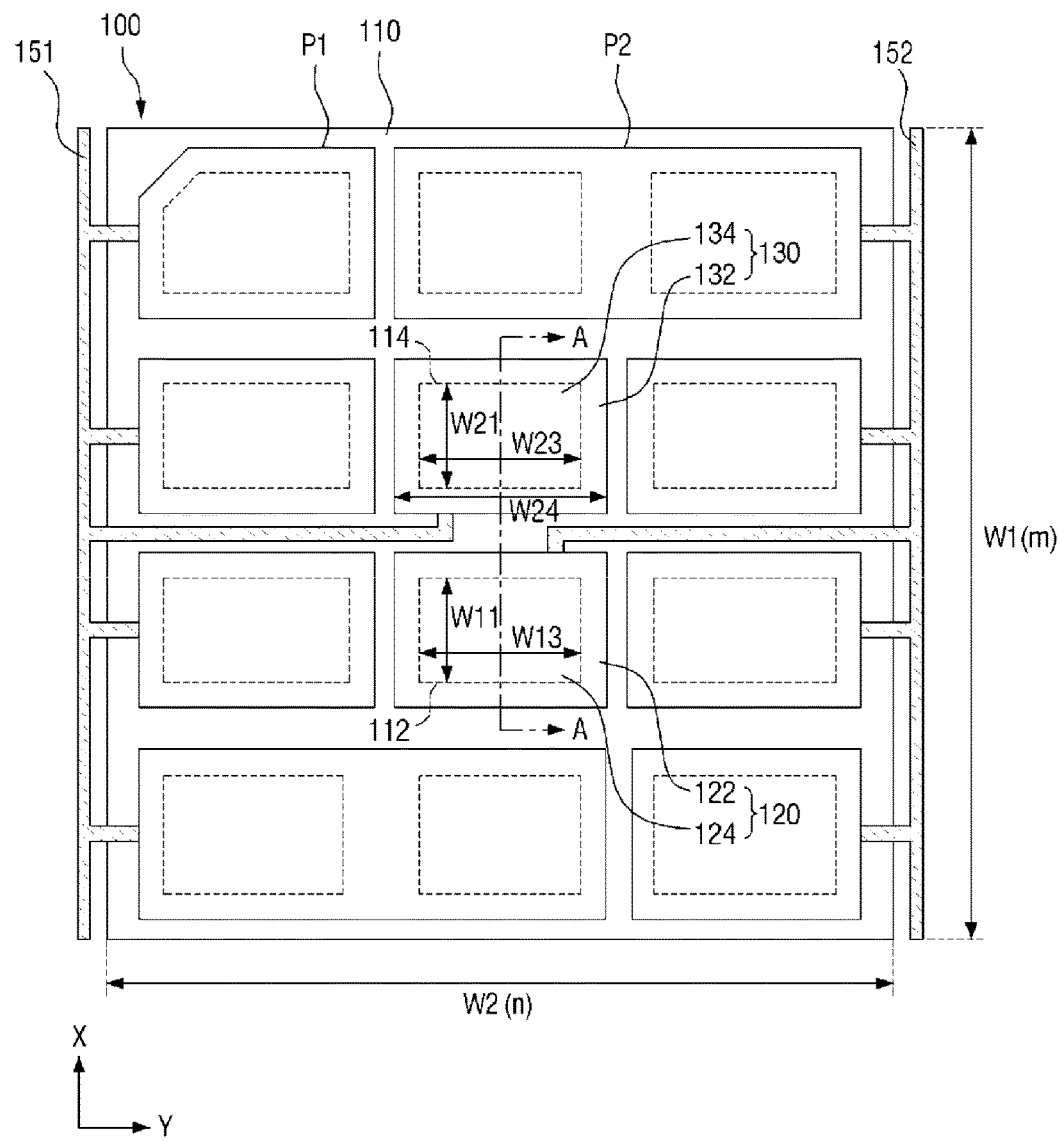
FIG. 1 is a layout diagram illustrating a light-emitting element mounting substrate according to an example embodiment.

FIG. 1 is a layout diagram illustrating a light-emitting element mounting substrate according to an example embodiment. FIG. 2 is a cross-sectional view taken along the line A-A of FIG. 1. For convenience of explanation, first and second conductive reflection films 125 and 135 are not shown in FIG. 1.

Figure 2:
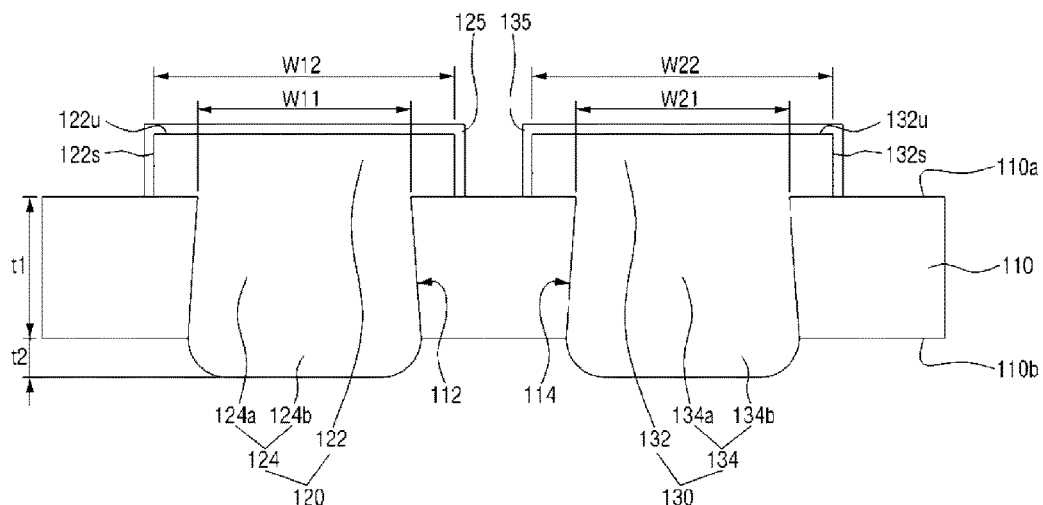
FIG. 2 is a cross-sectional view taken along the line A-A of FIG. 1.

Referring to FIGS. 1 and 2, the light-emitting element mounting substrate 100 according to an example embodiment may include an insulating base plate 110, a first wiring 120, a second wiring 130, a first connecting line 151, and a second connecting line 152.

The insulating base plate 110 may have flexibility, but the present example embodiment is not limited thereto.

The insulating base plate 110 may include a first surface 110a and a second surface 110b facing each other. The first surface 110a is disposed on the insulating base plate 110 and includes a plurality of pad regions arranged in a matrix form of m×n. Each of m and n is a natural number. The plurality of pad regions may be used an N-type pad or a P-type pad. The insulating base plate 110 includes an array-type pad region, and an array-type chip scale package (CSP) can be realized using the array-type pad region.

The pad regions formed on the insulating base plate 110 may include a first pad region P1 and a second pad region P2. The first pad region P1 is formed by a single pad region, and the second pad region P2 is formed by connecting at least two pad regions adjacent to each other. The pad regions may be modified according to the diversification of a wiring structure. However, the pad regions of the insulating base plate 110 may be defined based on a plurality of pad regions arranged in a matrix form of m×n.

The insulating base plate 110 may include a first through hole 112 and a second through hole 114 spaced apart from each other. In the insulating base plate 110, a plurality of through holes arranged in a matrix form of m×n may be formed based on the plurality of pad region arranged in a matrix form of m×n. The structure of the insulating base plate 110 will be described using the first through hole 112 and the second through hole 114.

The first through hole 112 and the second through hole 114 extend from the first surface 110a of the insulating base plate 110 to the second surface 110b of the insulating base plate 110, or may extend from the second surface 110b of the insulating base plate 110 to the first surface 110a of the insulating base plate 110. A width of the first through hole 112 may increase in a direction from the first surface to the second surface. Likewise, a width of the second through hole 114 may increase in the direction from the first surface to the second surface.

As shown in FIG. 2, each of the side wall of the first through hole 112 and the side wall of the second through hole 114 has an inclination. However, the present example embodiment is not limited thereto.

The insulating base plate 110 may have a single layer structure. The insulating base plate 110 may omit a laminate of a plurality of films. The insulating base plate 110 may omit an adhesive film formed on the first surface 110a and/or the second surface 110b.

The insulating base plate 110 may be a plastic plate made of polyimide, polyamide-imide, polyethylene naphthalate, epoxy, polyethylene terephthalate (PET), polymethyl methacrylate (PMMA), polycarbonate (PC), polyether sulfone (PES), polyester, aramid, or the like.

In the light-emitting element mounting substrate 100 according to example embodiments, it is assumed that the insulating base plate 110 is s plastic plate.

The first wiring 120 may include a first conductive pad 122 and a first through conduit 124. The first conductive pad 122 and the first through conduit 124 may be directly connected.

As shown in FIG. 1, each of the first conductive pad 122 and the second conductive pad 132 has a square shape. However, the present example embodiment is not limited thereto. The first conductive pad 122 may have a polygonal shape or a circular shape.

The first conductive pad 122 may be formed on the first surface 110a of the insulating base plate 110. The first conductive pad 122 may be in contact with the insulating base plate 110. That is, an intervening layer may not exist between the first conductive pad 122 and the insulating base plate 110.

The first conductive pad 122 may include a portion extending along the first surface 110a of the insulating base plate 110. A part of the first conductive pad 122 may overlap the first surface 110a of the insulating base plate 110.

The first through conduit 124 may be formed in the insulating base plate 110. The first through conduit 124 may fill the first through hole 112.

The first through conduit 124 may include a first portion 124a formed in the insulating base plate 110 and a second portion 124b protruding from the second surface 110b of the insulating base plate 110. In other words, in the direction of thickness of the insulating base plate 110, the thickness t1 of the insulating base plate 110 may be less than the thickness t1+t2 of the first through conduit 124.

Further, the thickness t2 of the second portion 124b of the first through conduit 124, protruding from the second surface 110b of the insulating base plate 110, may be less than the thickness t1 of the insulating base plate 110.

A part of the first through conduit 124 protrudes from the second surface 110b of the insulating base plate 110, but the first through conduit 124 may omit a portion extending along the second surface 110b of the insulating base plate 110.

The first wiring 120 may omit a conductive line or pad extending along the second surface 110b of the insulating base plate 110. That is, a conductive film, such as the first conductive pad 122, may not be formed on the second surface 110b of the insulating base plate 110.

The second wiring 130 may include a second conductive pad 132 and a second through conduit 134. The second conductive pad 132 and the second through conduit 134 may be directly connected.

The second conductive pad 132 may be formed on the first surface 110a of the insulating base plate 110. The second conductive pad 132 may be in contact with the insulating base plate 110. That is, an intervening layer may not exist between the second conductive pad 132 and the insulating base plate 110.

The second conductive pad 132 may include a portion extending along the first surface 110a of the insulating base plate 110. A part of the second conductive pad 132 may overlap the first surface 110a of the insulating base plate 110.

The second through conduit 134 may be formed in the insulating base plate 110. The second through conduit 134 may fill the second through hole 114.

The second through conduit 134 may include a first portion 134a formed in the insulating base plate 110 and a second portion 134b protruding from the second surface 110b of the insulating base plate 110. A part of the second through conduit 134 protrudes from the second surface 110b of the insulating base plate 110, but the second through conduit 134 may not include a portion extending along the second surface 110b of the insulating base plate 110.

Similarly to the first through conduit 124, the thickness of the second portion 134b of the second through conduit 134, protruding from the second surface 110b of the insulating base plate 110, may be less than the thickness t1 of the insulating base plate 110.

The second wiring 130 may omit a conductive line or pad extending along the second surface 110b of the insulating base plate 110.

The second conductive pad 132 is spaced apart from the first conductive pad 122, and the second through conduit 134 is spaced apart from the first through conduit 124. That is, the first wiring 120 and the second wiring 130 are not electrically and physically connected with each other.

The first conductive pad 122 and the second conductive pad 132 may contain the same material. For example, the first conductive pad 122 and the second conductive pad 132 may contain copper (Cu) or a copper alloy, but the present inventive concept is not limited thereto.

The first through conduit 124 and the second through conduit 134 may contain the same material. For example, the first through conduit 124 and the second through conduit 134 may contain copper (Cu) or a copper alloy, but the example embodiment is not limited thereto.

The first conductive pad 122 and the first through conduit 124 may contain the same material, and may also contain different materials from each other.

In the light-emitting element mounting substrate 100 according to example embodiments, wirings including the through conduits penetrating the insulating base plate 110 may be arranged in a matrix form.

A first conductive reflection film 125 may be formed on the first wiring 120. Specifically, the first conductive reflection film 125 may be formed on the first conductive pad 122. The first conductive reflection film 125 may be formed on a side wall 122s and an upper surface 122u of the first conductive pad 122. The first conductive reflection film 125 may be in contact with the first conductive pad 122.

A second conductive reflection film 135 may be formed on the second wiring 130. Specifically, the second conductive reflection film 135 may be formed on the second conductive pad 132. The second conductive reflection film 135 may be formed on a side wall 132s and an upper surface 132u of the second conductive pad 132. The second conductive reflection film 135 may be in contact with the second conductive pad 132.

Each of the first conductive reflection film 125 and the second conductive reflection film 135 may contain a metal. For example, each of the first conductive reflection film 125 and the second conductive reflection film 135 may contain at least one of aluminum (Al), silver (Ag), palladium (Pd), rhodium (Rh), and platinum (Pt).

With respect to the first surface 110a of the insulating base plate 110, the width W12 of the first conductive pad 122 in the first direction (X-direction) is greater than the width W11 of the first through conduit 124 in the first direction (X-direction). Further, the width W14 of the first conductive pad 122 in the second direction (Y-direction) is greater than the width W13 of the first through conduit 124 in the second direction (Y-direction).

That is, the first conductive pad 122 has widths greater than those of the first through conduit 124 in the first direction (X-direction) and the second direction (Y-direction).

The first conductive pad 122 may extend along the first surface 110a of the insulating base plate 110 according to the difference in width between the first conductive pad 122 and the first through conduit 124.

Similarly, with respect to the first surface 110a of the insulating base plate 110, the width W22 of the second conductive pad 132 in the first direction (X-direction) is greater than the width W21 of the second through conduit 134 in the first direction (X-direction). Further, the width W24 of the second conductive pad 132 in the second direction (Y-direction) is greater than the width W23 of the second through conduit 134 in the second direction (Y-direction).

The second conductive pad 132 has widths greater than those of the second through conduit 134 in the first direction (X-direction) and the second direction (Y-direction). The second through conduit 134 entirely overlaps the second conductive pad 132.

The first connecting line 151 is connected to the pad regions formed on the insulating base plate 110 to supply a power. For example, the second conductive pad 132 is electrically connected to the first connecting line 151 to receive a power.

Further, the second connecting line 152 is connected to the pad regions formed on the insulating base plate 110 to supply a power. The pad regions are not connected to the first connecting line 151. For example, the first conductive pad 122 is electrically connected to the second connecting line 152 to receive a power.

Figure 3:
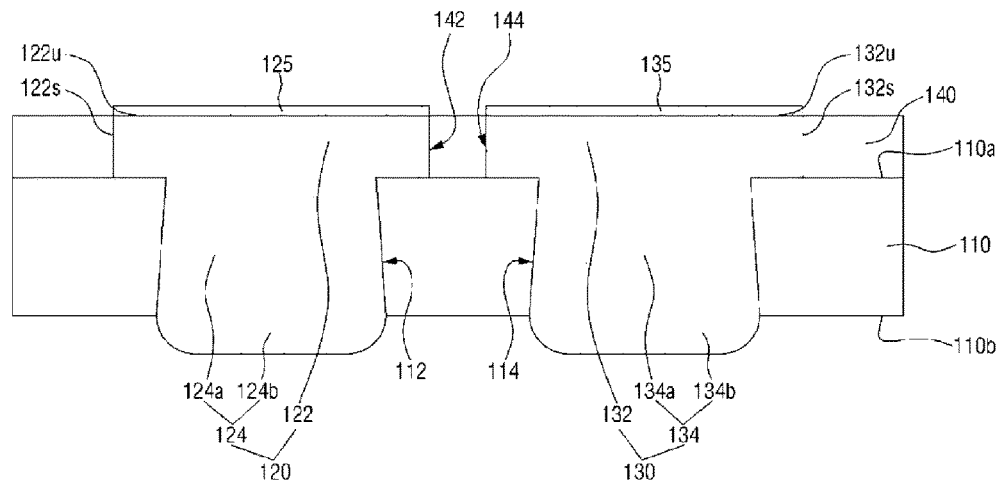
FIG. 3 is a cross-sectional view illustrating a light-emitting element mounting substrate according to another example embodiment.

FIG. 3 is a cross-sectional view illustrating a light-emitting element mounting substrate according to another example embodiment. For convenience of explanation, configurations different from those having been described with reference FIGS. 1 and 2 will be described. For reference, FIG. 3 is a cross-sectional view taken along the line A-A of FIG. 1.

Referring to FIG. 3, the light-emitting element mounting substrate 100 according to another example embodiment may further include an insulative reflection pattern 140.

The insulative reflection pattern 140 may be formed on the first surface 110a of the insulating base plate 110. The insulative reflection pattern 140 may be in contact with the insulating base plate 110.

The insulative reflection pattern 140 may include a first opening 142 and a second opening 144, which are spaced apart from each other.

The first conductive pad 122 may fill the first opening 142, and the second conductive pad 132 may fill the second opening 144. The insulative reflection pattern 140 may cover the side wall 122s of the first conductive pad 122 and the side wall 132s of the second conductive pad 132 formed on the first surface 110a of the insulating base plate 110.

Since the first conductive pad 122 fills the first opening 142, the first opening 142 may have widths greater than those of the first through hole 112 in the first direction (X-direction) and the second direction (Y-direction). Further, since the second conductive pad 132 fills the second opening 144, the second opening 144 may have widths greater than those of the second through hole 114 in the first direction (X-direction) and the second direction (Y-direction).

That is, the first opening 142 may entirely expose the first through hole 112, and the second opening 144 may entirely expose the second through hole 114.

The insulative reflection pattern 140 may contain a highly reflective material. For example, the insulative reflection pattern 140 may contain titanium dioxide (TiO2).

As shown in FIG. 3, the upper surface of the insulative reflection pattern 140, the upper surface 122*u* of the first conductive pad 122, and the upper surface 132*u* of the second conductive pad 132 are located on the same plane. However, the present inventive concept is not limited thereto.

The first conductive reflection film 125 is formed on the upper surface 122*u* of the first conductive pad 122, but is not formed on the side wall 122*s* of the first conductive pad 122. Similarly, the second conductive reflection film 135 is formed on the upper surface 132*u* of the second conductive pad 132, but is not formed on the side wall 132*s* of the second conductive pad 132.

The side wall 122*s* of the first conductive pad 122 and the side wall 132*s* of the second conductive pad 132 may be respectively in contact with the insulative reflection pattern 140.

Figure 4:
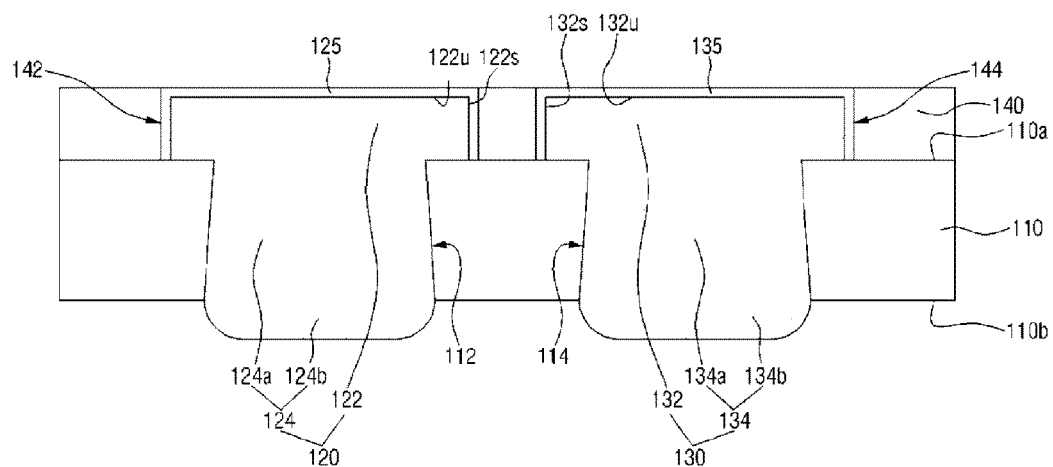
FIG. 4 is a cross-sectional view illustrating a light-emitting element mounting substrate according to still another example embodiment.

FIG. 4 is a cross-sectional view illustrating a light-emitting element mounting substrate according to another example embodiment. For convenience of explanation, configurations different from those having been described with reference FIG. 3 will be described.

Referring to FIG. 4, in the light-emitting element mounting substrate 100 according to another example embodiment, the first conductive reflection film 125 may extend onto the side wall 122*s* of the first conductive pad 122, and the second conductive reflection film 135 may extend onto the side wall 132*s* of the second conductive pad 132.

The insulative reflection pattern 140 may be in contact with the first conductive reflection film 125 formed on the side wall 122*s* of the first conductive pad 122 and the second conductive reflection film 135 formed on the side wall 132*s* of the second conductive pad 132.

Figure 5:
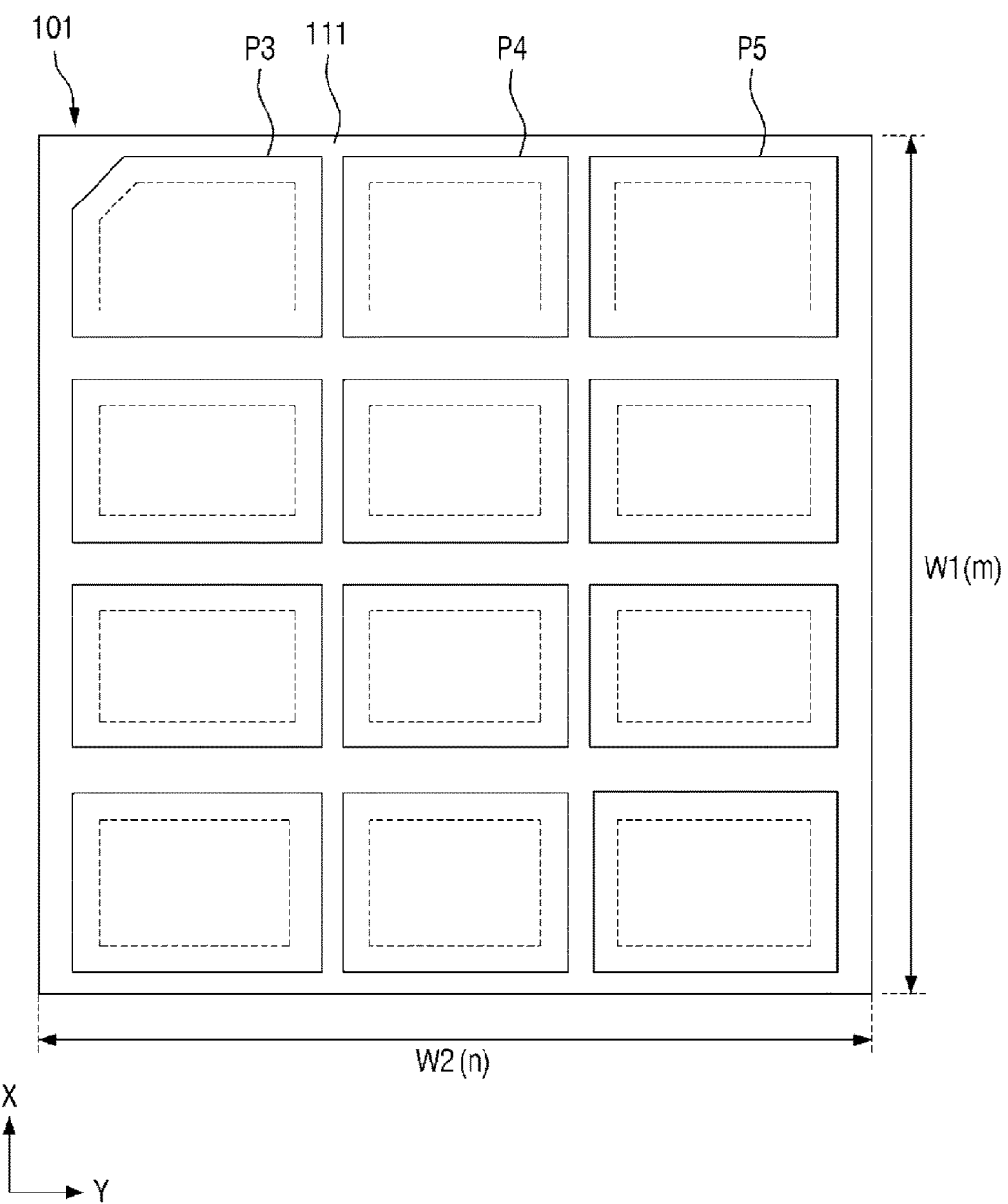
FIG. 5 is a layout diagram illustrating a light-emitting element mounting substrate according to another example embodiment.

FIG. 5 is a layout diagram illustrating a light-emitting element mounting substrate according to another example embodiment. For convenience of explanation, configurations different from those having been described with reference FIG. 1 will be described.

Referring to FIG. 5, in a light-emitting element mounting substrate 101 according to another example embodiment, an insulating base plate 111 may include a plurality of pad regions arranged in a matrix form of m×n. Each of m and n is a natural number. The plurality of pad regions may be used an N-type pad or a P-type pad.

All of the pad regions formed on the insulating base plate 111 are single pad regions. That is, the plurality of pad regions, such as third to fifth pad regions P3, P4 and P5, may be separated from each other and formed at positions corresponding to a plurality of through holes. According to various structures of chip scale package (CSP), a plurality of modified pad regions may also be formed.

Figure 6:
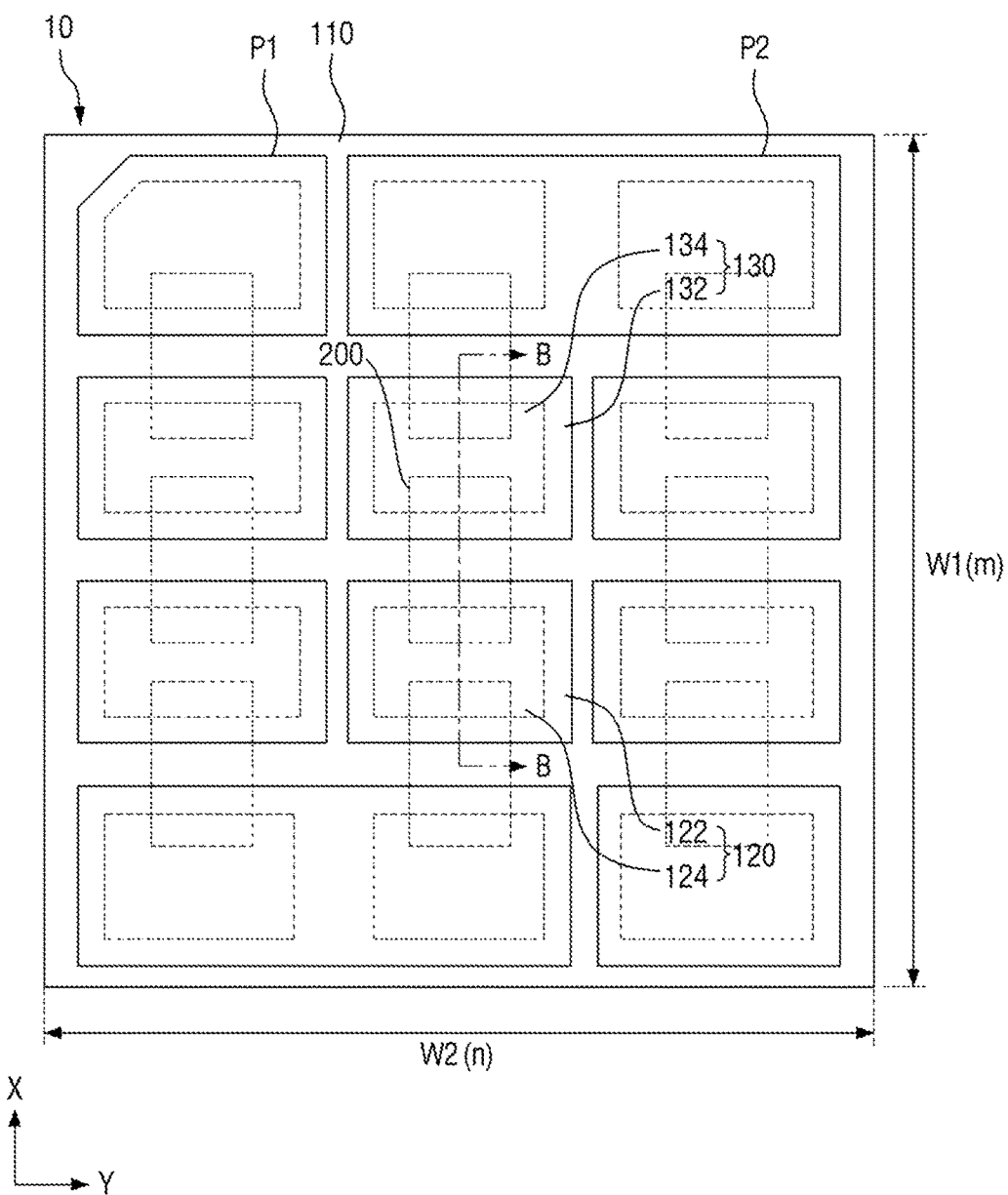
FIG. 6 is a layout diagram illustrating a light-emitting package according to still another example embodiment.
Figure 7:
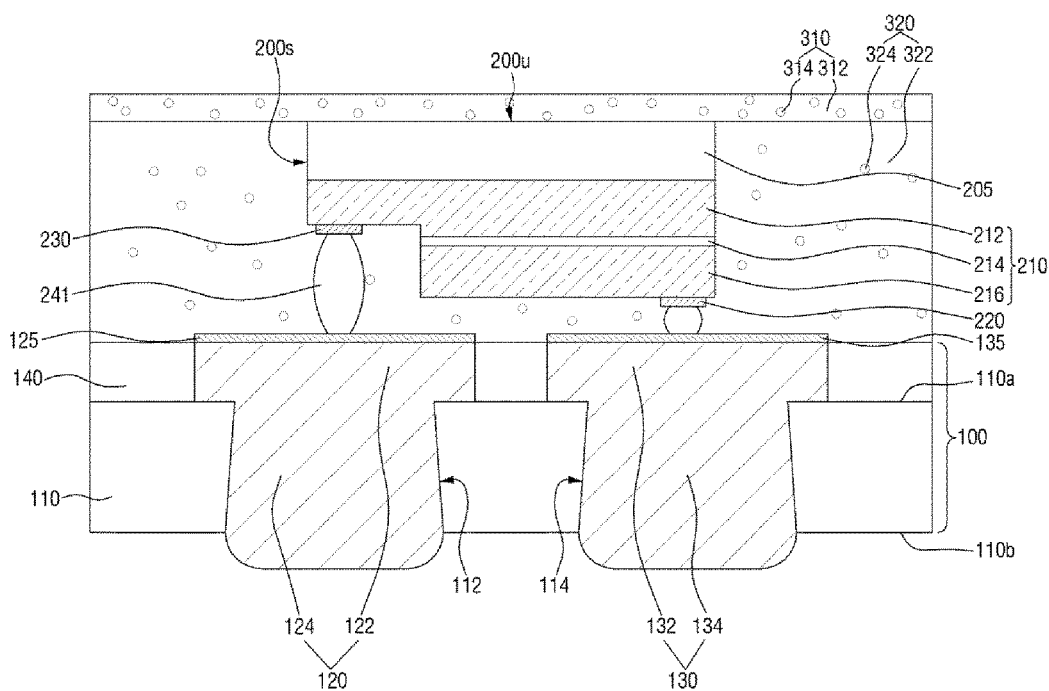
FIG. 7 is a cross-sectional view taken along the line B-B of FIG. 6.

FIG. 6 is a layout diagram illustrating a light-emitting package according to an example embodiment. FIG. 7 is a cross-sectional view taken along the line B-B of FIG. 6.

For reference, the light-emitting element mounting substrate 100 having been described with reference to FIG. 3 is shown in FIG. 7 as a light-emitting element mounting substrate 100. However, this is only illustrative, and the present example embodiment is not limited thereto. That is, the light-emitting element mounting substrate 100 shown in FIG. 7 may be the light-emitting element mounting substrate shown in FIG. 2 or FIG. 4.

Since a description of the light-emitting element mounting substrate 100 is redundant to that having been described with reference to FIGS. 1 to 4, the description thereof will be omitted.

Referring to FIGS. 6 and 7, the light-emitting package 10 according to an example embodiment may include the light-emitting element mounting substrate 100, a light-emitting element 200, a first fluorescent layer 310, and a second fluorescent layer 320.

The light-emitting element 200 may be mounted on the light-emitting element mounting substrate 100. Specifically, the light-emitting element 200 may be mounted on the first surface 110*a* of the insulating base plate 110 provided with the first conductive pad 122 and the second conductive pad 132. The light-emitting element may be electrically connected with the first wiring 120 and the second wiring 130.

The light-emitting element 200 may be formed corresponding to a position at which two pad regions of the plurality of pad regions arranged in a matrix form of m×n on the light-emitting element mounting substrate 100 overlap each other. For example, when m is 4 and n is 3, the nine light-emitting elements 200 may be formed on the light-emitting element mounting substrate 100. In this example, the number of the plurality of pad regions arranged in a matrix form of m×n is twelve, which is the sum of the number of the light-emitting elements 200 mounted on the light-emitting element mounting substrate 100 and an n value.

The light-emitting element 200 may include a substrate 205, a light-emitting structure 210, a first electrode 230, and a second electrode 220.

The substrate 205 may be a substrate for semiconductor growth. For example, the substrate 205 may be made of a semiconductor material having insulating properties and conductivity, such as sapphire, SiC, $MgAl_2O_4$, MgO, $LiAlO_2$, $LiGaO_2$, or GaN. Sapphire, which is a crystal having a hexa-rhombo (R3c) symmetry, has a c-axis lattice constant of 13.001 Å and an a-axis lattice constant of 4.758 Å, and has a C(0001) plane, an A(11-20) plane, and a R(1-102) plane. In this case, the C(0001) plane is generally used for a substrate for nitride growth because it makes the growth of a nitride film easy and is stable at high temperature.

The substrate 205 may be provided with a plurality of uneven structures.

The light-emitting structure 210 may include a first semiconductor pattern 212, a light-emitting pattern 214, and a second semiconductor pattern 126, which are sequentially laminated on the substrate 205.

A buffer layer may be additionally formed between the light-emitting structure 210 and the substrate 205. The material of the buffer layer is not limited as long as the buffer layer can serve as a seed layer for forming the light-emitting structure 210. For example, the material of the buffer layer may be $In_xAl_yGa_{(1-x-y)}N(0 \leq x \leq 1, 0 \leq y \leq 1)$ or $Si_xC_yN_{(1-x-y)}$ $(0 \leq x \leq 1, 0 \leq y \leq 1)$.

Each of the second semiconductor pattern 216, the light-emitting pattern, and the first semiconductor pattern 212 may contain $In_xAl_yGa_{(1-x-y)}N(0 \leq x \leq 1, 0 \leq y \leq 1)$ (i.e., various materials containing GaN). For example, each of the second semiconductor pattern 216, the light-emitting pattern, and the first semiconductor pattern 212 may contain GaN, AlGaN, InGaN, or AlInGaN.

Specifically explaining each of the patterns, the first semiconductor pattern 212 may be a first conductive type semiconductor pattern (for example, an n-type semiconductor pattern), and the second semiconductor pattern 216 may be a second conductive type semiconductor pattern (for example, a p-type semiconductor pattern). However, according to the design method, the first semiconductor pattern 212 may be a second conductive type semiconductor pattern (p-type semiconductor pattern), and the second semiconductor pattern 216 may be a first conductive type semiconductor pattern (n-type semiconductor pattern).

The light-emitting pattern 214 is a region in which light is emitted by the combination of carriers (for example, electrons) of the first semiconductor pattern 212 and carriers (for example, holes) of the second semiconductor pattern 216. The light-emitting pattern 214 includes a well layer and a barrier layer. Since the bandgap of the well layer is less than that of the barrier layer, carriers (electrons and holes) are gathered and combined in the well layer. This light-emitting pattern 214 is classified into a single quantum well (SQW) structure and a multiple quantum well (MQW) structure depending on the number of well layers. The single quantum well structure includes one well layer, and the multiple quantum well structure includes two or more well layers. In order to control the luminescent properties, at least one of well layers and barrier layers may be doped with at least one of B, P, Si, Mg, Zn, and Se.

The first electrode 230 may be electrically connected to the first semiconductor pattern 212, and the second electrode 220 may be electrically connected to the second semiconductor pattern 216.

Each of the first electrode 230 and the second electrode 220 may have a single layer structure or multiple layer structure of a conductive material. For example, each of the first electrode 230 and the second electrode 220 may contain at least one of silver (Ag), gold (Au), copper (Cu), zinc (Zn), aluminum (Al), indium (In), titanium (Ti), tin (Sn), magnesium (Mg), nickel (Ni), tungsten (W), platinum (Pt), chromium (Cr), tantalum (Ta), ruthenium (Ru), rhodium (Rh), iridium (Ir), palladium (Pd), and alloys thereof.

Each of the first electrode 230 and the second electrode 220 may contain a transparent conductive material. For example, each of the first electrode 230 and the second electrode 220 may contain at least one of indium tin oxide (ITO), aluminum zinc oxide (AZO), indium zinc oxide (IZO), ZnO, GZO (ZnO:Ga), $In_2O_3$, $SnO_2$, CdO, $CdSnO_4$, and $Ga_2O_3$.

The light-emitting element 200 used in the light-emitting package 10 according to an example embodiment may be a flip chip type light-emitting element.

Further, it has been described that the light-emitting element 200 includes a light-emitting structure containing a gallium nitride-based semiconductor. However, the present example embodiment is not limited thereto. The light-emitting element 200 may include a light-emitting structure containing an AlInGaP-based or AlInGaAs-based semiconductor.

The light-emitting element 200 may include an upper surface 200u and a side wall 200s. If the light-emitting structure 210 is formed on one side of the substrate 205, the upper surface 200u of the light-emitting element 200 may be disposed on the other side of the substrate 205 facing one side of the substrate 205. The side wall 200s of the light-emitting element 200 may include the side wall of the substrate 205 and the side wall of the light-emitting structure 210.

Explaining the connection between the light-emitting element 200 and the light-emitting element mounting substrate 100, the first electrode 230 may be connected to the first wiring 120 through a first conductive connector 241, and the second electrode 220 may be connected to the second wiring 130 through a second conductive connector 242.

The first fluorescent layer 310 may be formed on the upper surface 200u of the light-emitting element 200. The first fluorescent layer 310 may be conformally formed on the upper surface 200u of the light-emitting element 200.

The first fluorescent layer 310 may be a film type fluorescent layer, such as a fluorescent film.

The width of the first fluorescent layer 310 in the first direction (X-direction) and the width of the first fluorescent layer 310 in the second direction (Y-direction) may be substantially equal to the width of the light-emitting element mounting substrate 100 in the first direction (X-direction) and the width of the light-emitting element mounting substrate 100 in the second direction (Y-direction), respectively.

The second fluorescent layer 320 may be formed on the side wall 200s of the light-emitting element 200. The second fluorescent layer 320 may cover the side wall 200s of the light-emitting element 200.

As in FIG. 7, the upper surface of the second fluorescent layer 320 and the upper surface 200u of the light-emitting element 200 are placed on the same plane. However, the present example embodiment is not limited thereto. That is, a part of the side wall 200s of the light-emitting element 200 may be covered by the second fluorescent layer 320, and the rest of the side wall 200s of the light-emitting element 200 may be covered by the first fluorescent layer 310.

The second fluorescent layer 320 may be formed even on the upper surface 200u of the light-emitting element 200. In this case, the first fluorescent layer 310 may be formed on the upper surface 200u of the light-emitting element 200. The upper surface 200u may be provided with the second fluorescent layer 320.

The first fluorescent layer 310 may contain a first transparent resin 312 and a first fluorescent material 314, and the second fluorescent layer 320 may contain a second transparent resin 322 and a second fluorescent material 324.

When the light-emitting element 200 emits a blue light, each of the first and second fluorescent materials 314 and 324 may include a yellow fluorescent material, and may also include a red fluorescent material in order to increase a color rendering index (CRI). Further, when the light-emitting element emits UV light, each of the first and second fluorescent materials 314 and 324 may include red, green and blue (RGB) fluorescent materials.

The first transparent resin 312 is not particularly limited as long as it can stably disperse the first fluorescent material 314 and can be formed into a film. The second transparent resin 322 is not particularly limited as long as it can stably disperse the second fluorescent material 324 and can be formed into a film. Examples of each of the first transparent resin 312 and the second transparent resin 322 may include an epoxy resin, a silicone resin, a rigid silicone resin, a modified silicone resin, a urethane resin, an oxetane resin, an acrylic resin, a polycarbonate resin, and a polyimide resin.

Each of the first fluorescent materials 314 and the second fluorescent material 324 may be a material for absorbing light from the light-emitting element 2 and converting the light into light having a different wavelength. For example, each of the first fluorescent materials 314 and the second fluorescent material 324 may preferably include at least one selected from nitride/oxynitride phosphor primarily receiving energy from lanthanide elements, such as Eu and Ce; alkaline earth halogen apatite phosphor primarily receiving energy from lanthanide elements, such as Eu and the like, and transition metal elements, such as Mn and the like; alkaline earth metal borate halogen phosphor; alkaline earth metal aluminate phosphor; alkaline earth silicate phosphor; alkaline earth sulfide phosphor; alkaline earth thiogallate phosphor; alkaline earth silicon nitride phosphor; germanate phosphor; rare earth aluminate phosphor primarily receiving energy from lanthanide elements, such as Ce and the like; rare earth silicate phosphor; and organic complex phosphor primarily receiving energy from lanthanide elements, such as Eu and the like. Specific examples thereof are as follows, but the present inventive concept is not limited thereto.

The nitride phosphor primarily receiving energy from lanthanide elements, such as Eu and Ce may include $M_2Si_5N_8$:Eu (M is at least one selected from Sr, Ca, Ba, Mg, and Zn), and may further include $MSi_7N_{10}$:Eu, $M_{1.8}Si_5O_{0.2}N_8$:Eu, and $M_{0.9}Si_7O_{0.1}N_{10}$:Eu (M is at least one selected from Sr, Ca, Ba, Mg, and Zn).

The oxynitride phosphor primarily receiving energy from lanthanide elements, such as Eu and Ce may include $MSi_2O_2N_2$:Eu (M is at least one selected from Sr, Ca, Ba, Mg, and Zn).

The alkaline earth halogen apatite phosphor primarily receiving energy from lanthanide elements, such as Eu and the like, and transition metal elements, such as Mn and the like, may include $M_5(PO_4)_3X$:R (M is at least one selected from Sr, Ca, Ba, Mg, and Zn, X is at least one selected form F, Cl, Br, and I, and R is at least one selected form Eu, Mn, and Eu).

The alkaline earth metal borate halogen phosphor may include $M_2B_5O_9X$:R (M is at least one selected from Sr, Ca, Ba, Mg, and Zn, X is at least one selected from F, Cl, Br, and I, and R is at least one selected from Eu, Mn, and Eu).

The alkaline earth metal aluminate phosphor may include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from Eu, Mn, and Eu).

The alkaline earth sulfide phosphor may include $La_2O_2S$:Eu, $Y_2O_2S$:Eu, and $Gd_2O_2S$:Eu.

The rare earth aluminate phosphor primarily receiving energy from lanthanide elements, such as Ce and the like may include YAG-based phosphors, such as $Y_3Al_5O_{12}$:Ce, $(Y_{0.8}Gd_{0.2})_3Al_5O_{12}$:Ce, and $Y_3(Al_{0.8}Ga_{0.2})_5O_{12}$:Ce, which are represented by Composition Formula of $(Y,Gd)_3(Al, Ga)_5 O_{12}$. The rare earth aluminate phosphor may further include $Tb_3Al_5O_{12}$:Ce and $Lu_3Al_5O_{12}$:Ce, each of which is obtained by substituting at least a part of Y of $Y_3Al_5O_{12}$:Ce with Tb or Lu.

The alkaline earth silicate phosphor may be composed of silicate, and a typical example thereof may include $(SrBa)_2SiO_4$:Eu.

Other phosphors may include ZnS:Eu, $Zn_2GeO_4$:Mn, and $MGa_2S_4$:Eu (M is at least one selected from Sr, Ca, Ba, Mg, and Z, and X is at least one selected from F, Cl, Br, and I).

The aforementioned phosphors may contains at least one selected from Tb, Cu, Ag, Au, Cr, Nd, Dy, Co, Ni, and Ti instead of Eu or in addition to Eu, as needed.

As phosphors other than the aforementioned phosphors, phosphors having the same performance and effect as the first fluorescent material 314 and the second fluorescent material 324 may also be used.

The first fluorescent material 314 contained in the first fluorescent layer 310 and the second fluorescent material 324 contained in the second fluorescent layer 320 may have different materials or compositions from each other. Further, the first fluorescent material 314 contained in the first fluorescent layer 310 and the second fluorescent material 324 contained in the second fluorescent layer 320 may have the same materials or compositions as each other.

In the light-emitting package 10 according to an example embodiment, a lens may not be formed on the first fluorescent layer 310. That is, the light-emitting package 10 may omit a lens to reduce the size of the light-emitting package 10.

In addition, a method of manufacturing a light-emitting package according to an example embodiment will be described with reference to FIGS. 6 and 7.

First, the light-emitting element 200 is mounted on the light-emitting element mounting substrate 100. The light-emitting element 200 is connected to the light-emitting element mounting substrate 100 through the first conductive connector 241 and the second conductive connector 242.

Subsequently, the second fluorescent layer 320 covering the side wall 200s of the light-emitting element 200 is formed on the light-emitting element mounting substrate 100.

Subsequently, the film-type first fluorescent layer 310 is formed on the second fluorescent layer 320 and the upper surface 200u of the light-emitting element 200.

Figure 8:
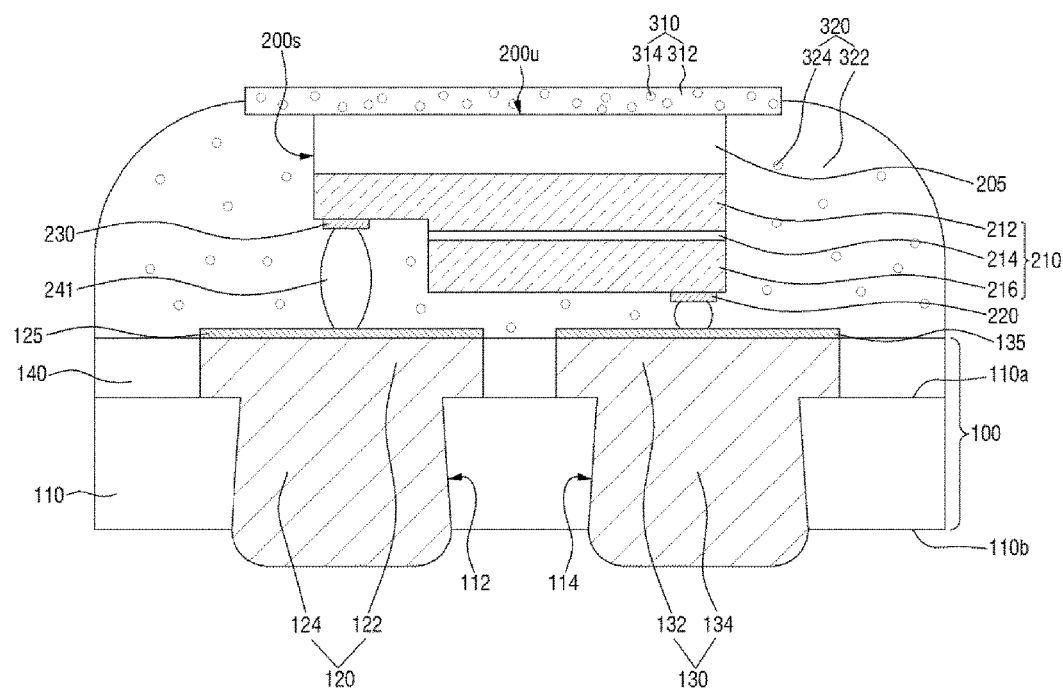
FIG. 8 is a cross-sectional view illustrating a light-emitting package according to another example embodiment.
Figure 9:
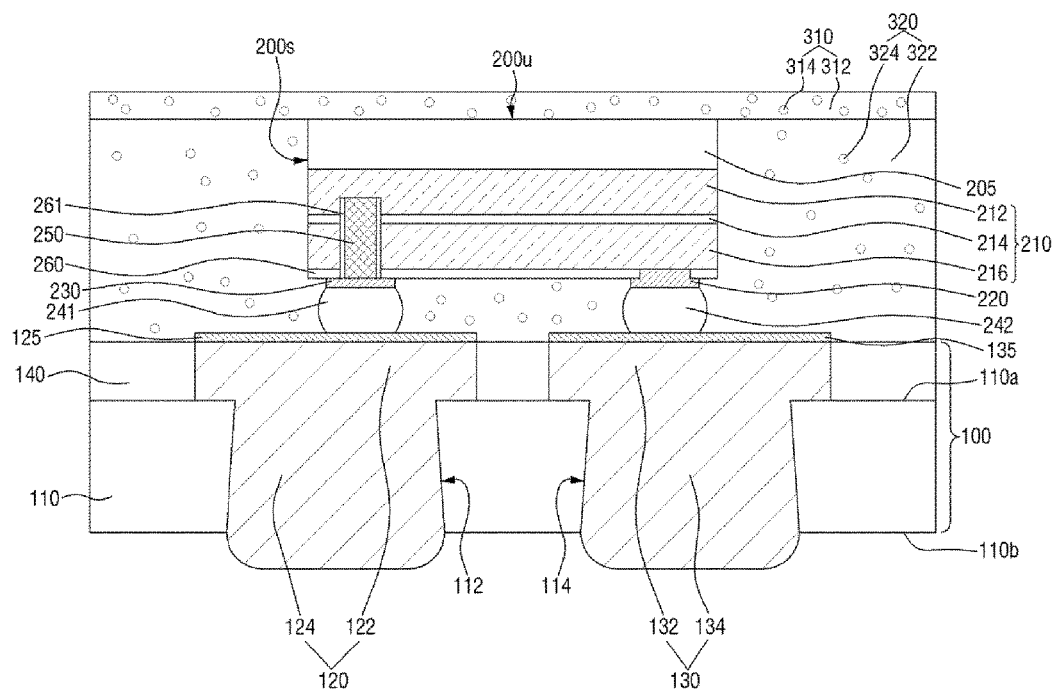
FIG. 9 is a cross-sectional view illustrating a light-emitting package according to still another example embodiment.

FIG. 8 is a cross-sectional view illustrating a light-emitting package according to another example embodiment. FIG. 9 is a cross-sectional view illustrating a light-emitting package according to still another example embodiment. For convenience of explanation, configurations different from those having been described with reference FIGS. 6 and 7 will be described.

Referring to FIG. 8, in the light-emitting package according to another example embodiment, the width of the first fluorescent layer 310 in the first direction (X-direction) and the width of the first fluorescent layer 310 in the second direction (Y-direction) are less than the width of the light-emitting element mounting substrate 100 in the first direction (X-direction) and the width of the light-emitting element mounting substrate 100 in the second direction (Y-direction), respectively.

The first fluorescent layer 310 may be in contact with the upper surface 200u of the light-emitting element 200. That is, an intervening fluorescent layer does not exist between the first fluorescent layer 310 and the substrate 205.

The upper surface of the second fluorescent layer 320 and the upper surface 200u of the light-emitting element 200 are not placed on the same plane.

A method of manufacturing a light-emitting package according to another example embodiment will be described with reference to FIGS. 6 and 8.

First, the light-emitting element 200 is mounted on the light-emitting element mounting substrate 100. The light-emitting element 200 is connected to the light-emitting element mounting substrate 100 through the first conductive connector 241 and the second conductive connector 242.

Subsequently, the film-type first fluorescent layer 310 is formed on the upper surface 200u of the light-emitting element 200.

Subsequently, the second fluorescent layer 320 covering the side wall 200s of the light-emitting element 200 is formed on the light-emitting element mounting substrate 100. The second fluorescent layer 320 is formed by filling the space between the first fluorescent layer 310 and the light-emitting element mounting substrate 100.

Referring to FIG. 9, in the light-emitting package 10 according to another example embodiment, the light-emitting element 200 may include a through via contact 250.

The through via contact 250 may extend from the first semiconductor pattern 212 to the first electrode 230. The through via contact 250 may connect the first semiconductor pattern 212 to the first electrode 230.

The light-emitting element 200 may include a first insulating pattern 260 and a second insulating pattern 261, which are formed on the second semiconductor pattern 216.

The first electrode 230 and the second electrode 220 may be formed on the first insulating pattern 260. The first insulating pattern 260 prevents the electrical connection between the first electrode 230 and the second semiconductor pattern 216.

The second insulating pattern 261 may be formed on the side wall of the through via contact 250. The second insulating pattern 261 prevents the electrical connection between the through via contact 250 and the light-emitting pattern 214 and the electrical connection between the through via contact 250 and the second semiconductor pattern 216.

FIGS. 10 to 15 are intermediate cross-sectional views illustrating a method of manufacturing a light-emitting element mounting substrate according to an example embodiment.

Figure 10:
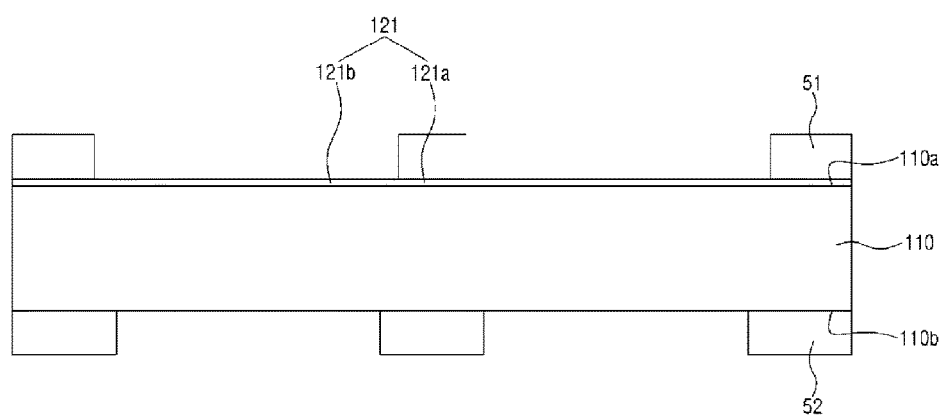
FIGS. 10 to 15 are intermediate cross-sectional views illustrating a method of manufacturing a light-emitting element mounting substrate according to an example embodiment.

Referring to FIG. 10, a plating seed layer 121 is formed on the first surface 110a of an insulating base plate 110.

The insulating base plate 110 includes a first surface 110a and a second surface 110b facing each other. The insulating base plate 110 may have a single layer structure.

The plating seed layer 121 is not formed on the second surface 110b of the insulating base plate 110. The plating seed layer 121 may be in contact with the insulating base plate 110.

The plating seed layer 121 includes a first portion 121a and a second portion 121b. The second portion 121b of the plating seed layer 121 is a portion on which first and second conductive pads (122 and 132 of FIG. 11) are formed later, and the first portion 121a of the plating seed layer 121 is a portion by which the first and second conductive pads 122 and 132 are spaced apart from each other.

The plating seed layer 121 may contain copper or a copper alloy.

Subsequently, a first mask pattern 51 is formed on the first surface 110a of the insulating base plate 110, and a second mask pattern 52 is formed on the second surface 110b of the insulating base plate 110.

The first mask pattern 51 is formed on the first portion 121a of the plating seed layer 121. That is, the second portion 121b of the plating seed layer 121 is exposed through the first mask pattern 51.

Figure 11:
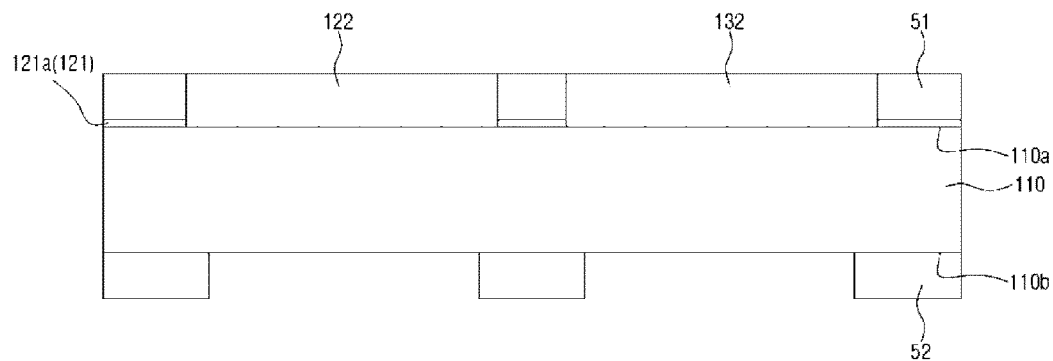

Referring to FIG. 11, the first conductive pad 122 and the second conductive pad 132 are formed on the first surface 110a of the insulating base plate 110 using the first mask pattern 51.

Specifically, the first conductive pad 122 and the second conductive pad 132 are formed on the second portion 121b of the plating seed layer 121. The second portion 121b is exposed through the first mask pattern 51.

The first conductive pad 122 and the second conductive pad 132 may be formed by a plating method.

Each of the first conductive pad 122 and the second conductive pad 132 may contain copper or a copper alloy.

The second portion 121b of the plating seed layer 121 may be made into a part of the first conductive pad 122 and a part of the second conductive pad 132.

Figure 12:
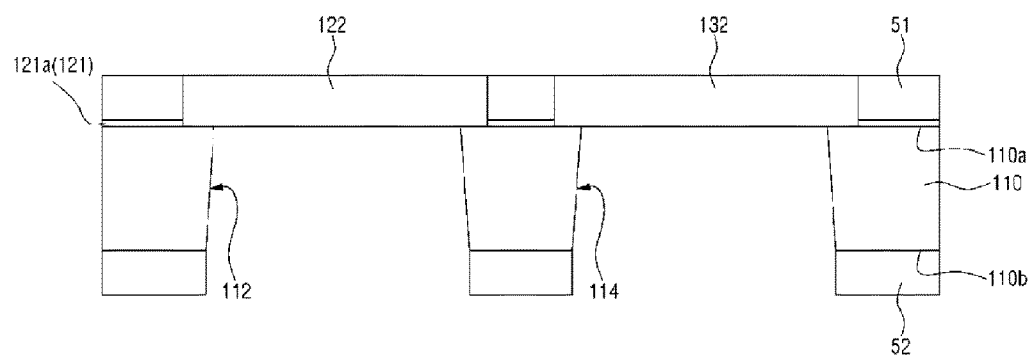

Referring to FIG. 12, a first through hole 112 and a second through hole 114 are formed in the insulating base plate 110. The first through hole 112 and the second through hole 114 are formed by using the second mask pattern 52 as a mask.

Each of the first through hole 112 and second through hole 114 formed in the insulating base plate 110 extends from the second surface 110b of the insulation base plate 110 to the first surface 110a of the insulating base plate 110.

A part of the first conductive pad 122 and a part of the second conductive pad 132 are exposed through the first through hole 112 and second through hole 114.

Figure 13:
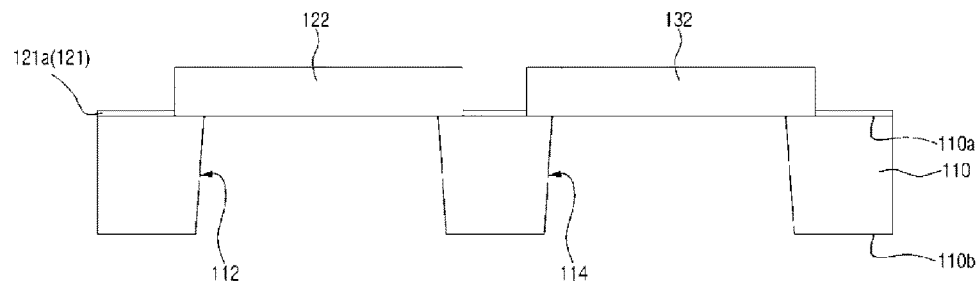

Referring to FIG. 13, the first mask pattern 51 and the second mask pattern 52 are removed.

When the first mask pattern 51 and the second mask pattern 52 are removed, the first portion 121a of the plating seed layer 121 and the second surface 110b of the insulating base plate 110 may be exposed.

Figure 14:
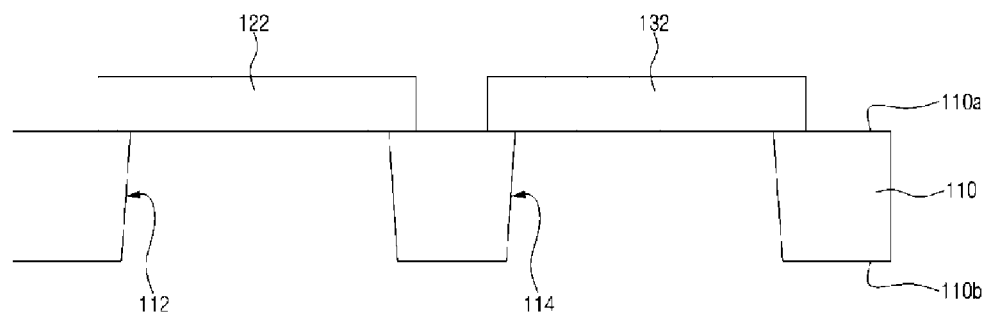

Referring to FIG. 14, the first portion 121a of the plating seed layer 121, which has been exposed by removing the first mask pattern, is removed.

When the first portion 121a of the plating seed layer 121 is removed, the first surface 110a of the insulating base plate 110 may be exposed.

Figure 15:
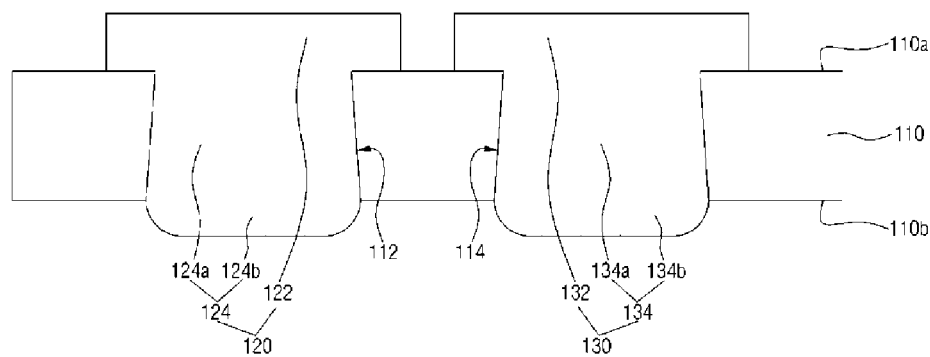

Referring to FIG. 15, a first through conduit 124 filling the first through hole 112 and a second through conduit 134 filling the second through hole 114 are formed.

Since the first through hole 112 and second through hole 114 respectively expose the first conductive pad 122 and the second conductive pad 132, the exposed first conductive pad 122 and second conductive pad 132 may serve as a seed layer for forming the first through conduit 124 and the second through conduit 134.

The first through conduit 124 and the second through conduit 134 may be formed by a plating method.

Each of the first through conduit 124 and the second through conduit 134 may contain copper or a copper alloy.

Since the first through conduit 124 and the second through conduit 134 are formed by a plating method, the first through conduit 124 and the second through conduit 134 may respectively include portions 124b and 134b protruding from the second surface 110b of the insulating base plate 110.

In this way, a first wiring 120 and a second wiring 130 may be formed.

Subsequently, referring to FIG. 2 again, a first conductive reflection film 125 is formed on the first conductive pad 122, and a second conductive reflection film 135 is formed on the second conductive pad 132.

The first conductive reflection film 125 and the second conductive reflection film 135 may be formed by a plating method. Therefore, the first conductive reflection film 125 may be formed on the upper surface 122u of the first conductive pad 122 and the side wall 122s of the first conductive pad 122, and the second conductive reflection film 135 may be formed on the upper surface 122u of the second conductive pad 132 and the side wall 122s of the second conductive pad 132.

Subsequently, referring to FIG. 4 again, an insulative reflection pattern 140 may be formed on the first surface 110a of the insulating base plate 110, the first surface 110a thereof being exposed by removing the first mask pattern 51.

The insulative reflection pattern 140 may cover the side wall 122s of the first conductive pad 122 provided with the first conductive reflection film 125 and the side wall 132s of the second conductive pad 132 provided with the second conductive reflection film 135.

Figure 16:
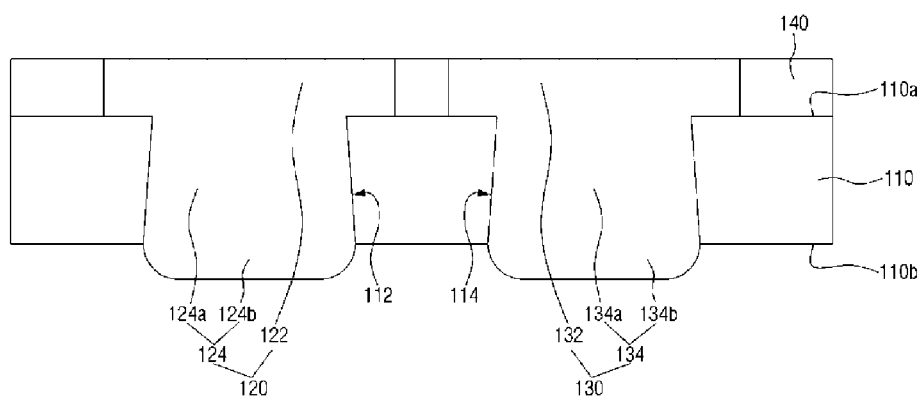
FIG. 16 is an intermediate cross-sectional view illustrating a method of manufacturing a light-emitting element mounting substrate according to an example embodiment.

FIG. 16 is an intermediate cross-sectional view illustrating a method of manufacturing a light-emitting element mounting substrate according to an example embodiment.

For reference, FIG. 16 may be an intermediate cross-sectional view after the step of FIG. 15. Therefore, descriptions of FIGS. 10 to 15 will be omitted.

Referring to FIG. 16, an insulative reflection pattern 140 may be formed on the first surface 110a of the insulating base plate 110, the first surface 110a thereof being exposed by removing the first mask pattern 51.

The insulative reflection pattern 140 may be in contact with the side wall 122s of the first conductive pad 122 and the side wall 132s of the second conductive pad 132.

Subsequently, referring to FIG. 3 again, a first conductive reflection film 125 is formed on the upper surface 122u of the first conductive pad 122, and a second conductive reflection film 135 is formed on the upper surface 132u of the second conductive pad 132.

The first conductive reflection film 125 is not extended between the first conductive pad 122 and the insulative reflection pattern 140, and the second conductive reflection film 135 is not extended between the second conductive pad 132 and the insulative reflection pattern 140.

Figure 17:
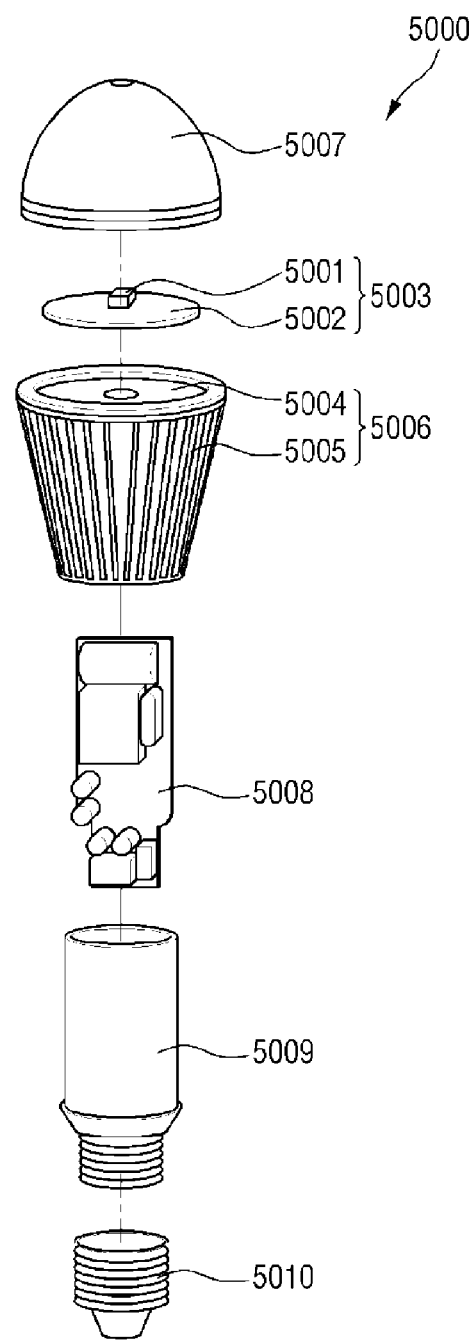
FIG. 17 is an exploded perspective view illustrating an example of an illumination apparatus, to which the light-emitting package is applied.

FIG. 17 is an exploded perspective view illustrating an example of an illumination apparatus, to which the light-emitting package according to example embodiments is applied.

Referring to FIG. 17, an illumination apparatus 5000, such as a bulb-type lamp, includes a light-emitting module 5003, a drive unit 5008, and an external connector 5010. The illumination apparatus 5000 may further include external structures, such as an outer housing 5006, an inner housing 5009, and a cover 5007.

The light-emitting module 5003 may include a light-emitting package 5001, which has a structure similar to that shown in FIGS. 6 to 9, and a circuit board 5002 on which the light-emitting package 5001 is mounted. In this example embodiment, one light-emitting package 5001 is mounted on the circuit board 5002. However, if necessary, two or more light-emitting packages 5001 may be mounted on the circuit board 5002.

The outer housing 5006 may act as a heat radiator, and may include a heat radiation plate 5004 directly in contact with the light-emitting module 5003 to improve a heat radiation effect, and a heat radiation fin 5005 surrounding the lateral side of the illumination apparatus 5000. The cover 5007 is mounted on the light-emitting module 5003, and may have a convex lens shape. The drive unit 5008 is mounted in the inner housing 5009, and is connected to the external connector 5010, such as a socket, to receive power from an external power source.

Further, the drive unit 5008 serves to convert and provide an appropriate current source capable of driving the light-emitting package 5001 of the light-emitting module 5003. For example, this drive unit 5008 may include an AC-DC converter, a rectifier circuit part, or the like.

The illumination apparatus 500 may further include a communication module.

Figure 18:
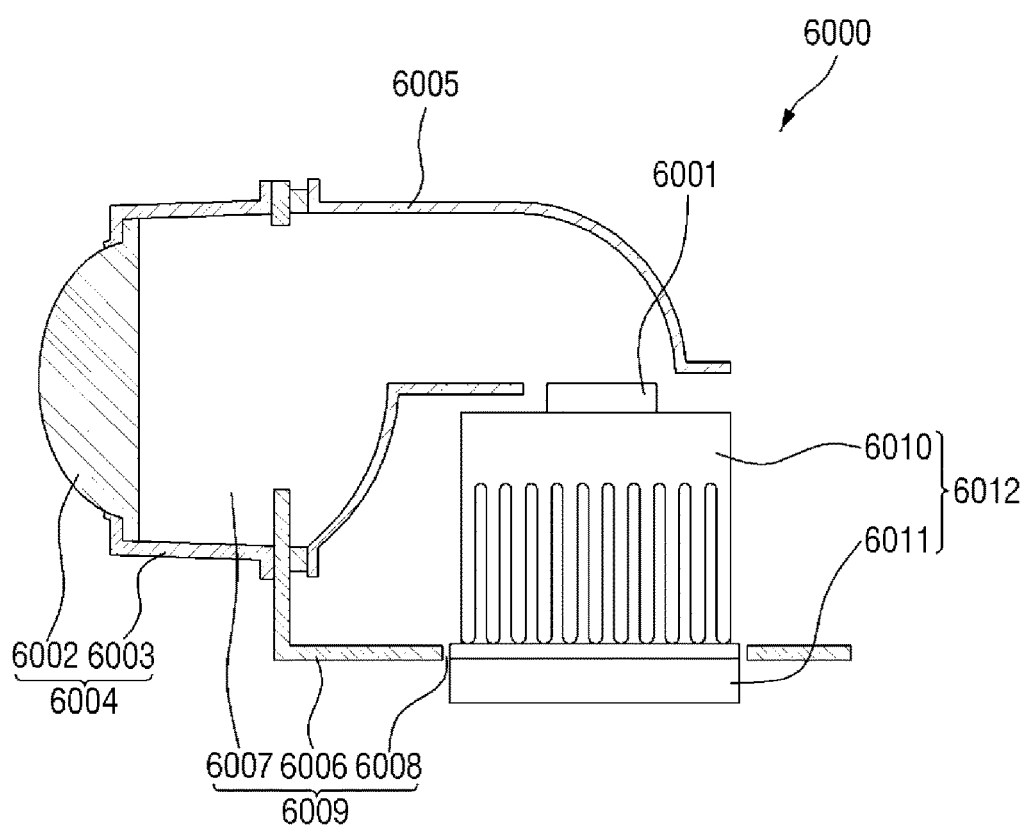
FIG. 18 is cross-sectional view illustrating an example of a headlight lamp, to which the light-emitting package is applied.

FIG. 18 is cross-sectional view illustrating an example of a headlight lamp, to which the light-emitting package according to example embodiments is applied.

Referring to FIG. 18, a headlight lamp 6000, which is used for vehicles, includes a light source 6001, a reflector 6005, and a lens cover 6004. The lens cover 6004 may include a hollow guide 6003 and a lens 6002. The light source 6001 may include at least one of the light emitting packages having been described with reference to FIGS. 6 to 9.

The headlight lamp 6000 may further include a heat radiator 6012 for discharging the heat generated from the light source 6001 to the outside. The heat radiator 6012 may include a heat sink 6010 and a cooling fan 6011 in order to perform effective heat radiation.

The headlight lamp 6000 may further include a housing 6009 for fixing and supporting the heat radiator 6012 and the reflector 6005. The housing 6009 may include a body 6006 and a central hole 6008 which is provided at one side of the body 6006 and through which the heat radiator 6012 is fitted and mounted.

The housing 6009 may include a front hole 6007 which is provided at the other side of the body 6006 integrally connected with the one side thereof and bent in a direction perpendicular to the one side thereof. The reflector 6005 is fixed to the housing 6009 to allow the light emitted from the light source 6001 to be reflected and emitted to the outside through the front hole 6007.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The foregoing example embodiments are merely exemplary and are not to be construed as limiting. The present teaching can be readily applied to other types of apparatuses. Also, the description of the example embodiments is intended to be illustrative, and not to limit the scope of the claims, and many alternatives, modifications, and variations will be apparent to those skilled in the art.

What is claimed is:

1. A light-emitting element mounting substrate, comprising:
    an insulating base plate comprising a first surface, a second surface facing the first surface, and a plurality of pad regions disposed on the first surface in an m-by-n matrix form, each of m and n being a natural number;
    a first conductive pad that is disposed in one of the plurality of pad regions and is in contact with the insulating base plate;

a second conductive pad that is disposed in another one of the plurality of pad regions apart from the first conductive pad and is in contact with the insulating base plate;
a first through hole disposed at a position corresponding to the first conductive pad to penetrate the insulating base plate;
a second through hole that is disposed at a position corresponding to the second conductive pad to penetrate the insulating base plate and is spaced apart from the first through hole;
a first through conduit filling the first through hole and being in contact with the first conductive pad; and
a second through conduit filling the second through hole and being in contact with the second conductive pad,
wherein the first through conduit includes a first projection portion protruding from the second surface, and the second through conduit includes a second projection portion protruding from the second surface,
wherein the first projection portion and the second projection portion do not cover any portion of the second surface, and
wherein a width of the first through conduit and a width of the second through conduit are greater than a distance between the first conductive pad and the second conductive pad.

2. The light-emitting element mounting substrate of claim 1,
wherein a number of the plurality of pad regions is a sum of a number of chips mounted on the insulating base plate and a value of n.

3. The light-emitting element mounting substrate of claim 1, further comprising:
an insulative reflection pattern disposed on the first surface and covering a side wall of the first conductive pad and a side wall of the second conductive pad.

4. The light-emitting element mounting substrate of claim 3,
wherein the insulative reflection pattern contains titanium dioxide ($TiO_2$).

5. The light-emitting element mounting substrate of claim 1, further comprising:
a first conductive reflection film disposed on the first conductive pad; and
a second conductive reflection film disposed on the second conductive pad.

6. The light-emitting element mounting substrate of claim 5,
wherein the first conductive reflection film is disposed on an upper surface and a side wall of the first conductive pad, and the second conductive reflection film is disposed on an upper surface and a side wall of the second conductive pad.

7. The light-emitting element mounting substrate of claim 5,
wherein the first conductive reflection film is disposed on an upper surface of the first conductive pad without covering a side wall of the first conductive pad to expose the side wall of the first conductive pad, and the second conductive reflection film is disposed on an upper surface of the second conductive pad without covering a side wall of the second conductive pad to expose the side wall of the second conductive pad.

8. The light-emitting element mounting substrate of claim 1,
wherein each of the first conductive pad and the second conductive pad includes a portion extending along the first surface.

9. The light-emitting element mounting substrate of claim 1,
wherein a first height of the first projection portion and a second height of the second projection portion are less than a thickness of the insulating base plate.

10. The light-emitting element mounting substrate of claim 1,
wherein the insulating base plate is a polyimide base plate.

11. The light-emitting element mounting substrate of claim 1,
wherein a width of the first through hole increases in a direction from the first surface to the second surface.

12. The light-emitting element mounting substrate of claim 1,
wherein a width of the second through hole increases in a direction from the first surface to the second surface.

13. A light-emitting package, comprising:
a light-emitting element mounting substrate;
a light-emitting element mounted on the light-emitting element mounting substrate;
a first fluorescent layer disposed on an upper surface of the light-emitting element; and
a second fluorescent layer covering a side wall of the light-emitting element,
wherein the light-emitting element mounting substrate comprises:
an insulating base plate comprising a first surface, a second surface facing the first surface, and a plurality of pad regions disposed on the first surface in an m-by-n matrix form, each of m and n being a natural number;
a first conductive pad that is disposed in one of the plurality of pad regions and is in contact with the insulating base plate; and
a second conductive pad that is disposed in another one of the plurality of pad regions apart from the first conductive pad and is in contact with the insulating base plate,
a first through hole disposed at a position corresponding to the first conductive pad to penetrate the insulating base plate;
a second through hole that is disposed at a position corresponding to the second conductive pad to penetrate the insulating base plate and is spaced apart from the first through hole;
first through conduit filling the first through hole and being in contact with the first conductive pad, wherein the first through conduit includes a first projection portion protruding from the second surface; and
second through conduit filling the second through hole and being in contact with the second conductive pad, wherein the second through conduit includes a second projection portion protruding from the second surface, and
wherein the light-emitting element is disposed to overlap the first conductive pad and the second conductive pad,
wherein the first projection portion and the second projection portion do not cover any portion of the second surface, and wherein a width of the first through conduit and a width of the second through conduit are greater than a distance between the first conductive pad and the second conductive pad.

14. The light-emitting package of claim 13,
wherein a number of the plurality of pad regions is a sum of a number of light-emitting elements mounted on the light-emitting element mounting substrate and a value of n.

15. The light-emitting package of claim 13,
wherein a fluorescent material contained in the first fluorescent layer is different from a fluorescent material contained in the second fluorescent layer.

16. The light-emitting package of claim 13,
wherein the light-emitting element mounting substrate further comprises an insulative reflection pattern disposed on the first surface and covering a side wall of the first conductive pad and a side wall of the second conductive pad.

17. The light-emitting package of claim 13,
wherein the light-emitting element mounting substrate further includes a first conductive reflection film disposed on the first conductive pad, and a second conductive reflection film disposed on the second conductive pad.

18. The light-emitting package of claim 13, further comprising:
a first conductive connector that is disposed on the first conductive pad and connects the first conductive pad to the light-emitting element; and
a second conductive connector that is disposed on the second conductive pad and connects the second conductive pad to the light-emitting element.

19. The light-emitting package of claim 13,
wherein the first fluorescent layer is a film type fluorescent layer.

20. The light-emitting package of claim 13, wherein the light-emitting element is a flip chip type light-emitting element.

* * * * *